United States Patent [19]
Wen

[11] Patent Number: 5,851,884
[45] Date of Patent: Dec. 22, 1998

[54] STRUCTURE AND MANUFACTURING METHOD FOR ROM

[75] Inventor: Jemmy Wen, Hsinchu, Taiwan

[73] Assignee: United Microelectronics Corp., Hsinchu, Taiwan

[21] Appl. No.: 857,857

[22] Filed: May 16, 1997

[30] Foreign Application Priority Data

Jan. 17, 1997 [TW] Taiwan .................................. 86100118

[51] Int. Cl.$^6$ .............................................. H01L 21/8234
[52] U.S. Cl. ............................................ 438/275; 438/282
[58] Field of Search .......................... 438/128, 275–279, 438/282; 257/390–392

[56] References Cited

U.S. PATENT DOCUMENTS 5,510,287  4/1996  Chen et al. ................................ 437/52
5,615,946  4/1997  Hsu et al. ................................. 257/390
5,627,091  5/1997  Hong ........................................ 438/276

*Primary Examiner*—Joni Chang
*Attorney, Agent, or Firm*—Finnegan, Henderson, Farabow, Garrett & Dunner, L.L.P.

[57] ABSTRACT

A structure and manufacturing method for ROM suitable for high density component fabrication, mainly consisting of conducting diode memory cells having a forward bias voltage of about 0.4V located above a silicon substrate, and of non-conducting memory cells having only the bit lines embedded in the substrate, forming a memory unit for the storage and retrieval of data bits at the junction crossing between each word line and each bit line. When a suitable operating voltage is applied to a word line, a change of current flow detected in the selected bit line represents either the ON or OFF state of a memory unit and hence reflects the coded data bit.

17 Claims, 7 Drawing Sheets

STRUCTURE AND MANUFACTURING METHOD FOR ROM

BACKGROUND OF THE INVENTION

1. Field of Invention

This invention relates in general to the structure and manufacturing method for read-only-memories (ROMs), and more particularly to the structure and manufacturing method for ROMs having a diode as the basic memory unit and suitable for high density components.

2. Description of Prior Art

ROMs are now widely used in digital equipment such as microcomputer and microprocessor operating systems. Resident programs used by the operating systems such as BIOS are normally kept in ROMs. Due to the rather complicated manufacturing processes for ROMs, involving many time consuming steps and material processing procedures, customers generally will submit their program codes to the memory manufacturer, and then the manufacturer will generate masks accordingly, before coding the information into semi-finished memory taken from the warehouse.

To a certain extent, the designs of modern memories are limited by the advances in semiconductor manufacturing technologies, and therefore any further reduction in the size of memory units requires continued improvements in the repertoire of manufacturing techniques. Conventional ROMs are composed from a matrix of metallic oxide semiconductor field effect transistors (MOSFETs), with each field effect transistor representing one memory cell unit. Each field effect transistor so formed provides one of two characteristic selected values for the transistor. For example, one such selectivity is the threshold voltage of the transistor. By implanting impurities into the channel region of a transistor, the transistor will have a lower threshold voltage, and can be switched on when a gate voltage $V_{cc}$ is applied. Without any impurities implanted into the channel region of a transistor, the transistor will have a higher threshold voltage, and therefore will not be turned on by the application of the same gate voltage $V_{cc}$. Through the selective implantation of impurities into the channel regions of transistors, binary data bits are stored in the memories. Those transistors having a channel implantation can represent the storage of a logic "0", while for those transistors having no channel implantation can represent the storage of a logic "1".

FIG. 1A is a top view showing part of a conventional ROM. The ROM has a plurality of separate parallel bit lines 12a~12c buried beneath the field oxide areas 100 and acting as the source/drain diffusion regions for the transistors. These bit lines, together with the different doping impurity concentrations between the lines, determine whether a data bit "0" or "1" is stored, so that resulting transistor memory units can have any combination of states. Overlying and running across the bit lines are a plurality of parallel word lines such as 18 (WL1) and 18' (WL2) through which the stored data are accessed by the application of a different voltage. FIG. 1B is a perspective view showing part of the cut-out section along the sectioning line IB—IB of FIG. 1A. The section consists of a P-type semiconductor substrate 10, buried bit lines 12a, 12b and 12c beneath the field oxide areas 100, a thin second type insulating layer 14 and word lines 18 and 18' crossing over the bit lines. FIG. 1C is a circuit diagram corresponding to the ROM unit shown in FIG. 1B.

The ROM specified above uses a channel transistor as its fundamental memory unit, and therefore, a rather large volume is occupied by individual components. In addition, in the process of miniaturizing component dimensions, short channel effects will emerge resulting in a rather large leakage current. Also, the operating current of the memory is limited by the threshold voltage ($V_t$) of the transistor, and hence when the word line is operating at a low voltage, the starting current of the memory transistor can be too weak to differentiate separate data bits in read/write operations.

SUMMARY OF THE INVENTION

It is therefore an object of this invention to provide a structure and manufacturing method for ROM which fully utilizes wafer areas to increase ROM component density and which is capable of storing and retrieving information under a low operating voltage without the necessity to reduce component dimensions.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve the objects and in accordance with the purpose of the invention, as embodied and broadly described herein, the invention comprises a ROM structure having a plurality of bit lines mutually parallel and separate from each other formed above a substrate, a first insulating layer selectively formed on the surface of the bit lines, a second insulating layer formed in areas between the bit lines above the silicon substrate, and a plurality of word lines formed above the bit lines and the second insulating layer. The word lines cross over the bit lines so that, at the junction areas between the word lines and the bit lines, there are a plurality of ON state diode memory units having electrical connection with the bit lines, and a plurality of OFF state diode memory units not having any electrical connection with the bit lines.

In another aspect, the invention is directed to a manufacturing method for a ROM having the steps of forming sequentially a first type silicon layer and a second type silicon layer on a substrate; forming a first insulating layer above the second type silicon layer; etching selectively the first insulating layer, the second type silicon layer and the first type silicon layer so as to form a plurality of bit lines; forming a second insulating layer in between the bit lines; etching sequentially the second insulating layer, the first insulating layer and the second type silicon layer so as to form contact windows in the bit lines; forming a second insulating layer on the peripheral sidewalls of the contact windows; performing an ion implantation operation so as to implant first type carrier into the first type silicon layer surface through the contact windows forming first type carrier contact windows; etching selectively the first insulating layer at desired locations above the bit lines in a program coding procedure which comprises the steps of forming a conducting layer and of etching the conducting layer so as to form word lines crossing over the bit lines resulting in electrical connection with the bit lines at locations having the first insulating layer removed in the previous step.

It is to be understood that both the foregoing general description and the following detailed description are exemplary and explanatory only and are not restrictive of the invention, as claimed.

BRIEF DESCRIPTION OF THE DRAWINGS

Other objects, features, and advantages of the invention will become apparent from the following detailed description of the preferred but non-limiting embodiment. The description is made with reference to the accompanying drawings which are incorporated in and constitute a part of this specification, illustrate one embodiment of the invention and together with the description, serve to explain the principles of the invention. In the drawings.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

FIGS. 2A through 2H are a series of cross-sectional views showing the manufacturing flow of a ROM according to one preferred embodiment of this invention.

Figure 1A:
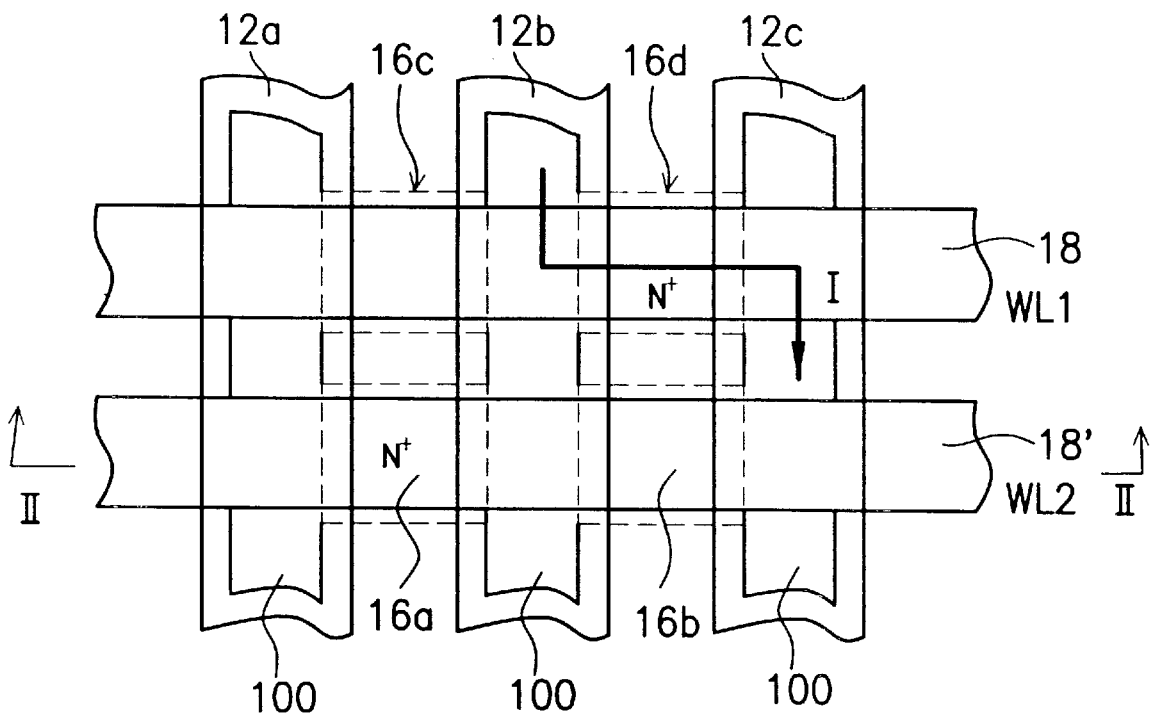
FIG. 1A is a schematic top plan view showing a conventional ROM.
Figure 1B:
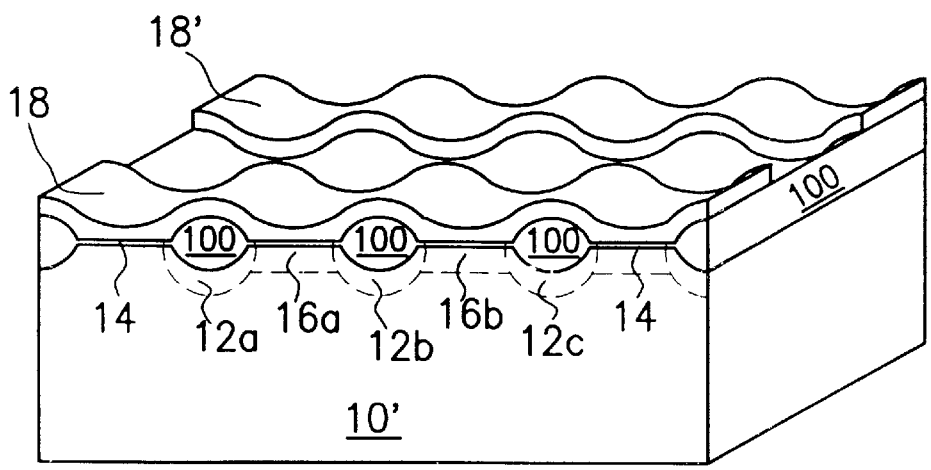
FIG. 1B is a perspective cross-sectional view along sectioning line IB—IB of the ROM in FIG. 1A.
Figure 1C:
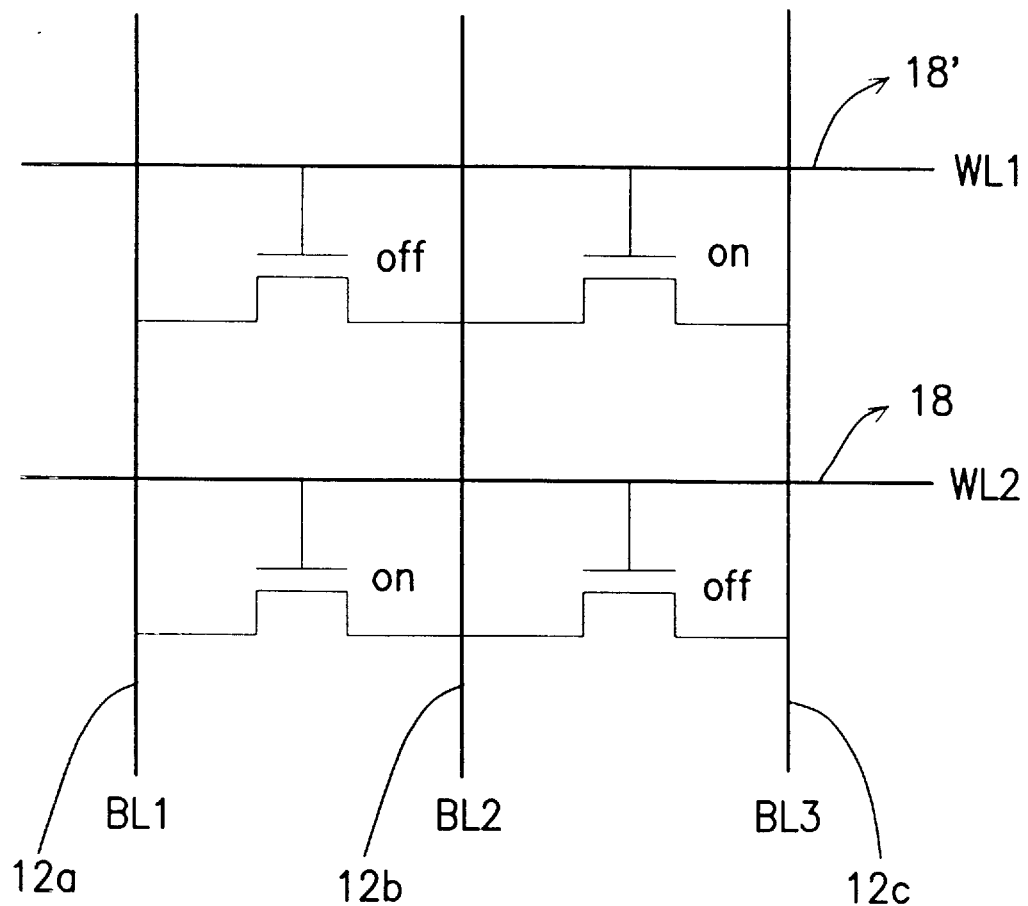
FIG. 1C is an equivalent circuit diagram corresponding to the ROM of FIG. 1A.
Figure 2A:
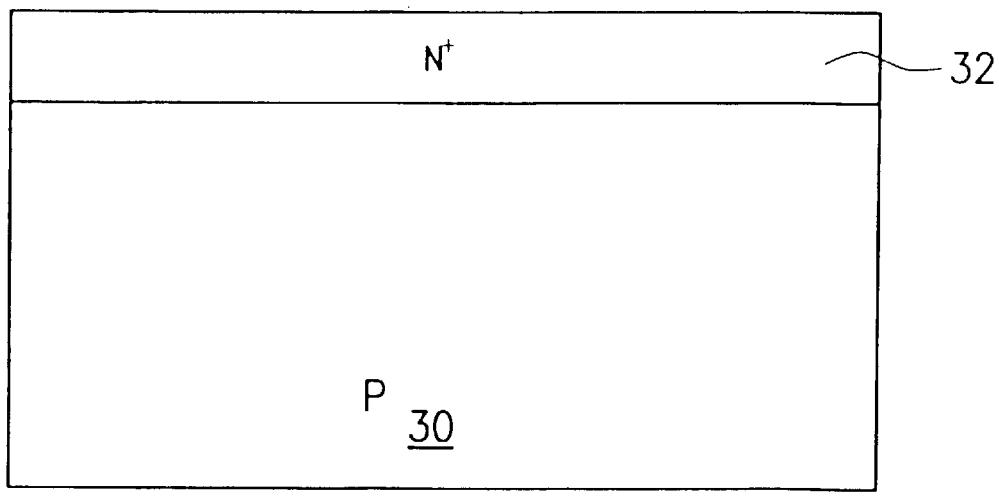
FIGS. 2A through 2H are a series of cross-sectional views showing the manufacturing flow of a ROM according to one preferred embodiment of this invention.
Figure 2B:
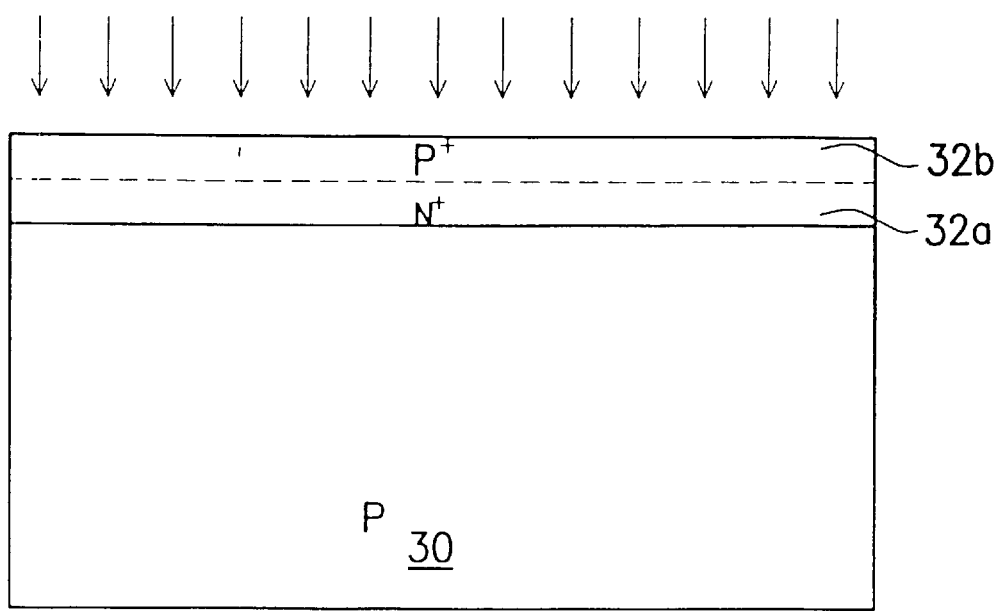

Referring to FIG. 2A and FIG. 2B, a substrate 30 is provided and formed, for example, of a second type of P-type silicon substrate, or of a first type of N-type silicon substrate, or of an electrically insulating substrate. A first type silicon layer 32a and a second type silicon layer 32b are formed sequentially above the substrate 30, for example, by the method of first doping arsenic or phosphorus ions into an N-type epitaxial silicon 32 (as shown in FIG. 2A) formed above the second type of P-type silicon substrate, and then doping the surface of the N-type epitaxial silicon 32 with P-type carrier (for example, boron ions) to form a P-type silicon layer/N-type silicon layer composite layer (as shown in FIG. 2B). Epitaxial silicon is not the only material that can be used, as other materials, such as amorphous silicon or polysilicon, are also equally applicable. In this embodiment, the first type carrier is either an N-type carrier or a P-type carrier. When the first type is an N-type carrier, the second type is a P-type carrier, but when the first type is a P-type carrier, then the second type is an N-type carrier.

Figure 2C:
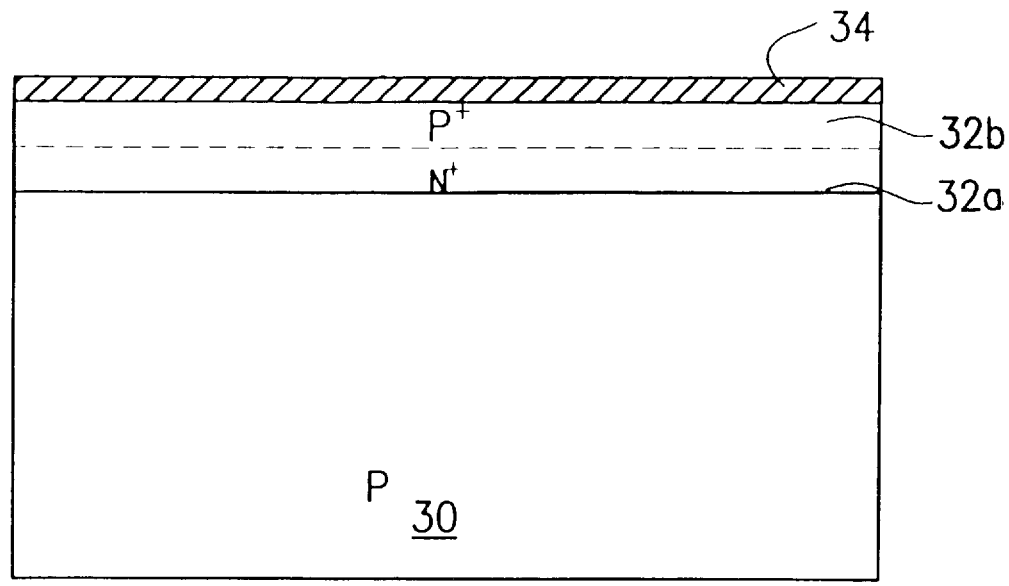

In the subsequent step, represented in FIG. 2C, a first insulating layer 34, for example a deposited silicon nitride layer ($Si_3N_4$), is formed above the second type silicon layer 32b.

Figure 2D:
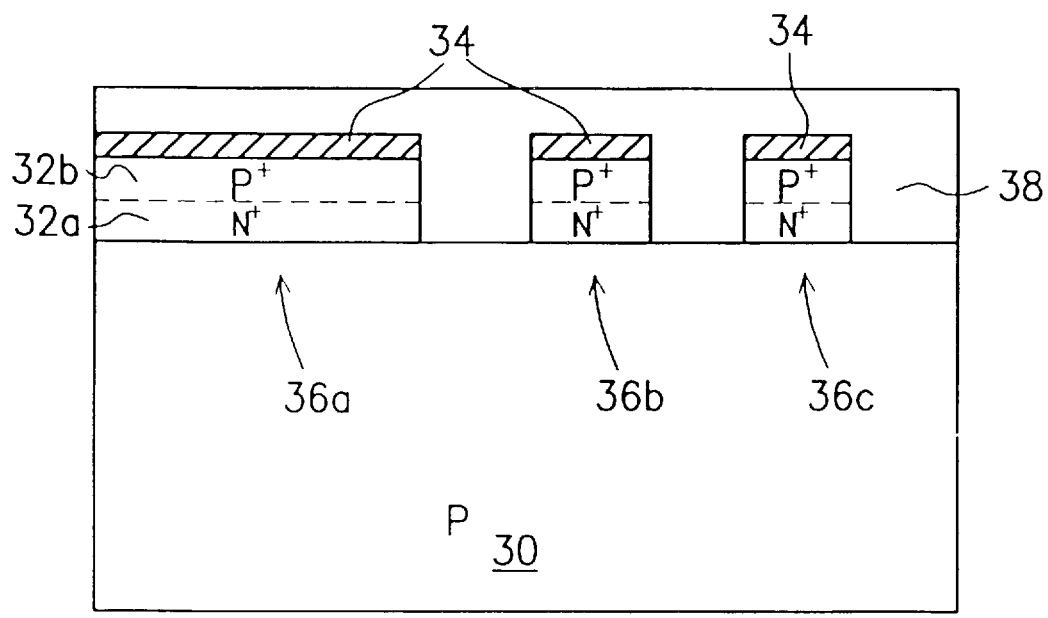

In the subsequent step, shown in FIG. 2D, the first insulating layer, the second type silicon layer 32b and the first type silicon layer 32a are selectively etched forming a plurality of bit lines 36a, 36b and 36c mutually parallel but separate from each other above the substrate 30, with each bit line consisting of a first type and a second type carriers. Next, a second insulating layer 38 is formed above the substrate 30 and covering the bit lines 36a, 36b and 36c as well, for example using a chemical vapor deposition method to form a silicon dioxide layer ($SiO_2$).

Figure 2E:
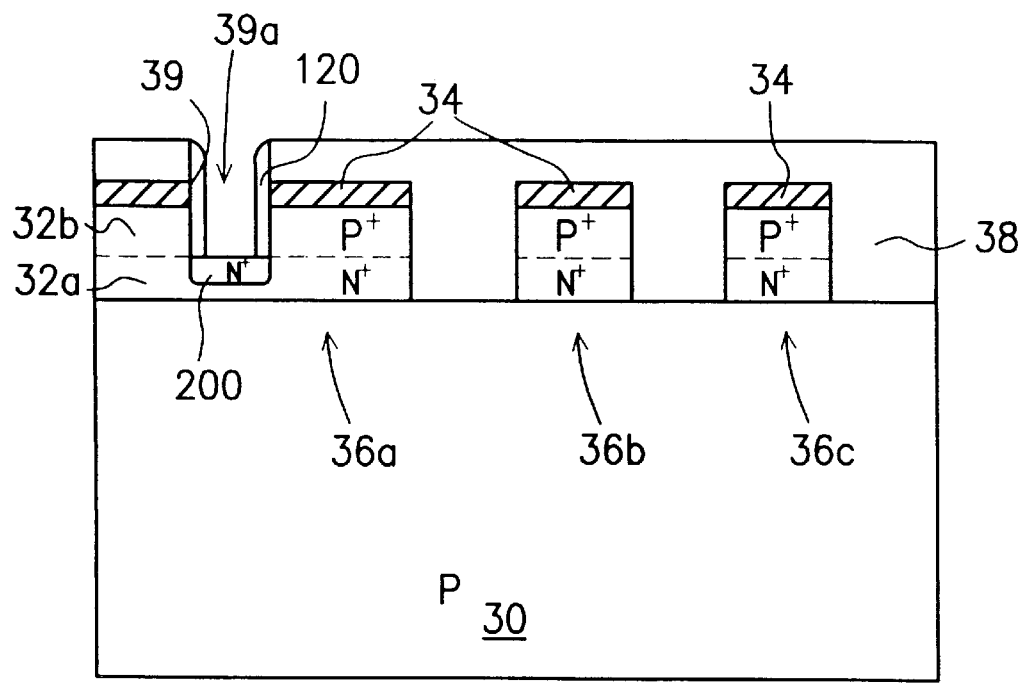

As depicted in FIG. 2E, the second insulating layer 38, the first insulating layer 34 and the second type silicon layer are sequentially etched to form a contact window 39 (only the contact window for bit line 36a is labeled in FIG. 2E). Next, an insulating layer 120 is formed on the peripheral sidewalls of the contact window 39, and then an ion implantation is performed to implant first type carrier into the first type silicon layer 32a surface through the contact window 39, forming a first type ion doped region 200 that becomes a first type carrier contact window 39a. The first type carrier contact window 39a is a node electrode serving as a connection from the bit lines to external circuits.

Figure 2F:
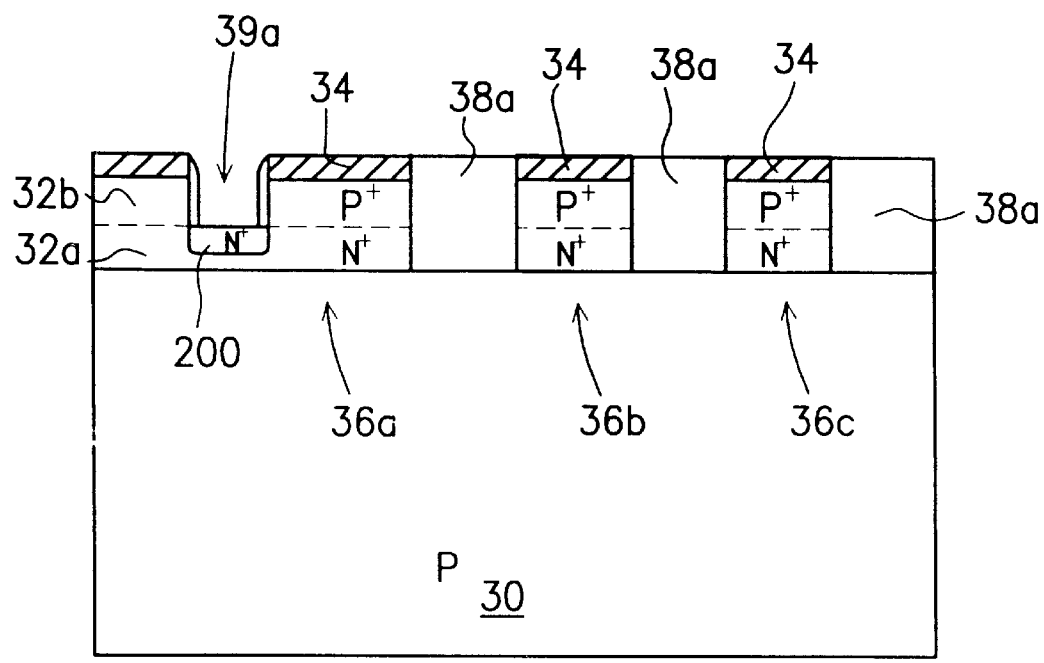

Thereafter, as in FIG. 2F, the second insulating layer 38 is etched back using the first insulating layer 34 as an etching stop layer so as to expose the first insulating layer 34 surface, and leaving behind the second insulating layer 38a in between the bit lines, having its upper surface at a height almost equal to the surface of the first insulating layer 34.

Figure 2G:
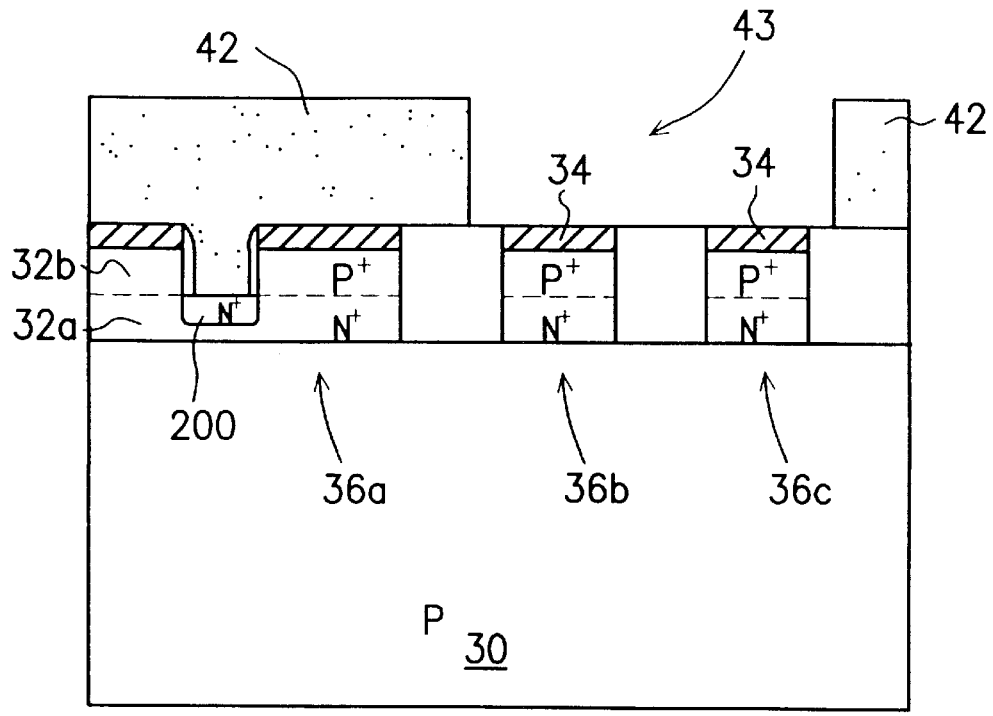

In the subsequent step, as shown in FIG. 2G, program coding is performed by forming a photolithographically processed photoresist layer 42 so as to expose the desired etching locations 43.

Figure 2H:
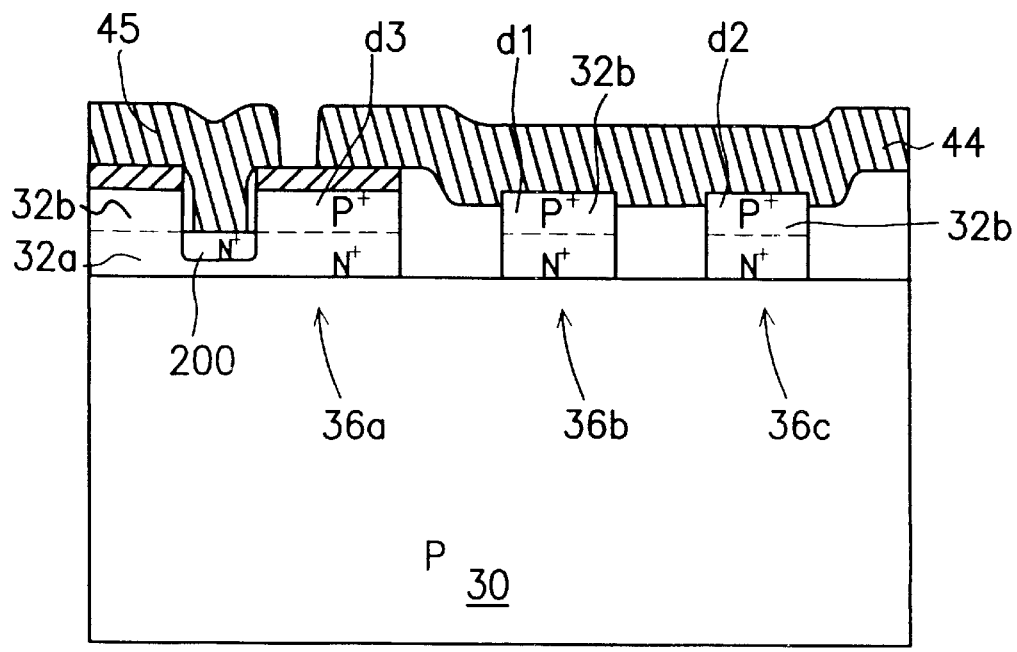

Lastly, as depicted in FIG. 2H, the first insulating layer 34 not covered by the photoresist layer 42 is etched, so as to expose the second silicon layer 32b on desired locations along bit lines such as 36b and 36c, and forming diodes d1, d2 and d3. Regions 43 having their first insulating layer 34 removed during the etching operation become ON state memory cell units, while regions still having their first insulating layer 34 on top become OFF state memory cell units. Finally, a conducting layer is formed (not shown in the Figure), and then etched to form word line 44 as well as conducting wire 45 connected to the first type carrier contact window 39. This completes the manufacturing operation for the ROM.

Figure 3:
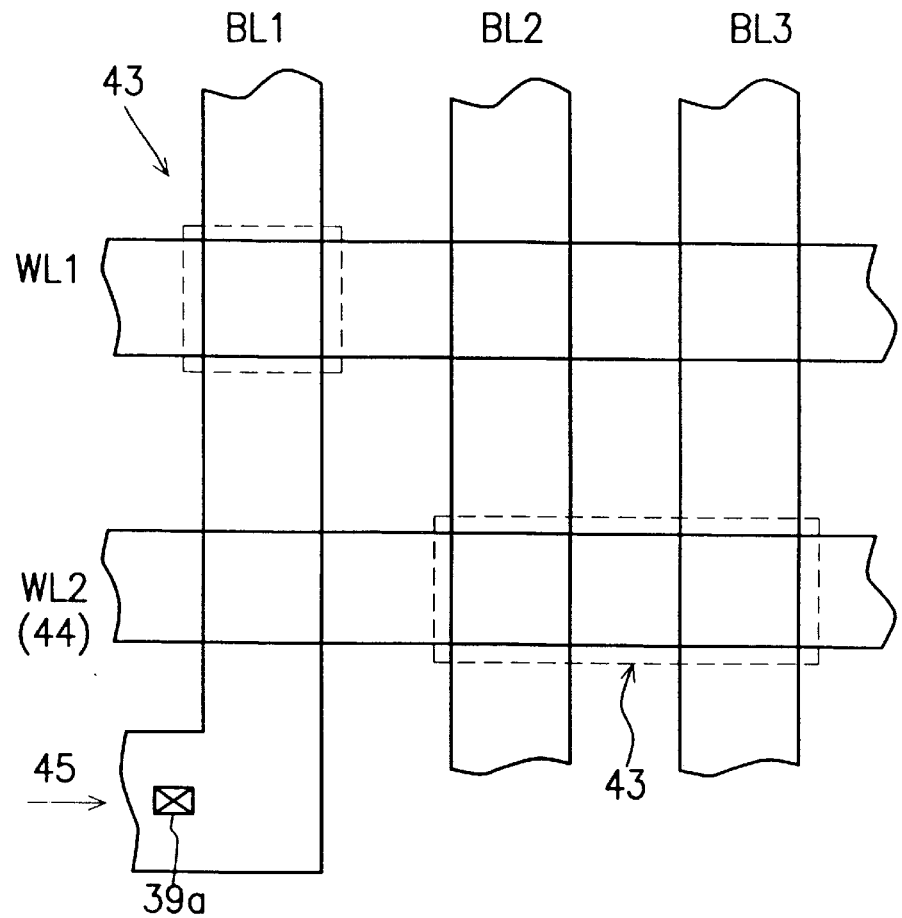
FIG. 3 is a schematic top plan view showing a ROM fabricated according to a preferred embodiment of this invention.
Figure 4:
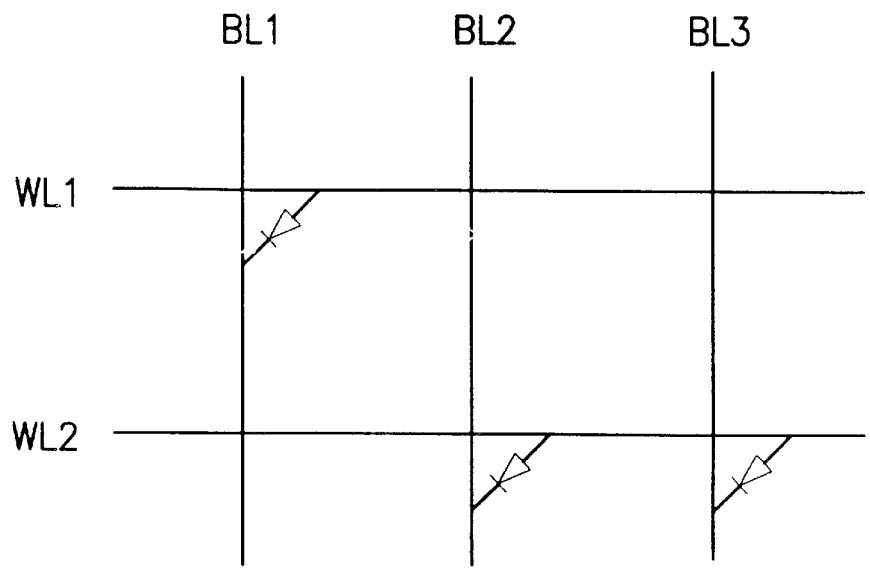
FIG. 4 is an equivalent circuit diagram corresponding to the ROM of FIG. 3.

For a better description of the ROM fabricated according to this embodiment, refer to FIG. 3 and FIG. 4.

FIG. 3 is a top view showing the ROM structure created according to this invention. At the junction between word lines WL1, WL2 and bit lines BL1, BL2 and BL3, memory cell units are formed. Regions 43 are areas showing the locations for ON state memory units, while 39a shows a first type carrier contact window for bit line BL1. An equivalent circuit diagram of this ROM is shown in FIG. 4.

As a summary, the ROM structure outlined in this invention acts according to the distinct controlling voltages applied to the word line WL1 so that a probable conducting pathway to one of the bit lines BL1, BL2 or BL3 is established through a voltage differential with all the rest of the bit lines under a floating state. Hence, at the junction between a selected word line and a selected bit line, the actual memory state of the memory unit is reflected accordingly. The ROM here operates, for example, by applying a first voltage on a desired word line and a second voltage, or earth, on a desired bit line while leaving the rest of the bit lines in a floating state, and then detecting any current flow in the bit line having the second voltage level. When the second type carrier is a P-type, the first voltage applied is a positive voltage while the second voltage is a negative voltage, but when the second type carrier is an N-type, then the first voltage applied is a negative voltage while the second voltage is a positive voltage.

The forward biased voltage for diode memory units is about 0.4V, and no detectable current is sensed when the memory unit is in the OFF state. The use of diodes, instead of the metallic oxide semiconductor (MOS) field effect transistors of a conventional ROM, not only increases the memory component density, but also overcomes the errors in transferring information resulting from low operating voltage for the MOS memory components, because the operating voltage demanded by diodes is intrinsically low.

While the invention has been described by way of example and in terms of the preferred embodiment, it is to be understood that the invention is not limited to the disclosed embodiments. It will be apparent to those skilled in the art that various modifications and variations can be made to the preferred embodiment of the present invention without departing from the scope or spirit of the invention.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing method for ROM, comprising the steps of:
   (a) forming sequentially a first conductivity type silicon layer and a second conductivity type silicon layer on a substrate;
   (b) forming a first insulating layer above the second conductivity type silicon layer;
   (c) etching selectively the first insulating layer, the second conductivity type silicon layer and the first conductivity type silicon layer so as to form a plurality of bit lines;
   (d) forming a second insulating layer over and in between the bit lines;
   (e) etching sequentially the second insulating layer, the first insulating layer and the second conductivity type silicon layer so as to form contact windows in the bit lines;
   (f) forming a third insulating layer on a peripheral sidewalls of the contact windows;
   (g) performing an ion implantation operation for implanting first conductivity type carrier into a surface of the first conductivity type silicon layer through the contact windows and removing the second insulating layer over the bit lines for forming first conductivity type carrier contact windows;
   (h) etching selectively the first insulating layer at selected locations above the bit lines in a program coding procedure comprising the sub-steps of:
   (I) forming a conducting layer; and
   (II) etching the conducting layer so as to form word lines crossing over the bit lines and resulting in electrical connections with the bit lines at locations where the first insulating layer was selectively etched.

2. The manufacturing method of claim 1, wherein the first conductivity type silicon layer is a N-type epitaxial silicon layer, and the second type silicon layer is a P-type epitaxial silicon layer.

3. The manufacturing method of claim 1, wherein the first conductivity type silicon layer is a P-type epitaxial silicon layer, and the second type silicon layer is a N-type epitaxial silicon layer.

4. The manufacturing method of claim 1, wherein the substrate is a second conductivity type silicon substrate.

5. The manufacturing method of claim 4, wherein the steps of forming the first conductivity type silicon layer and the second conductivity type silicon layer comprise forming a heavily doped first conductivity type epitaxial silicon layer above the second conductivity type silicon substrate, and performing an ion implantation operation so as to change electrical property on surface of the first conductivity type epitaxial silicon layer, resulting in a composite layer formed from the second conductivity type silicon layer and first conductivity type silicon layer.

6. The manufacturing method of claim 1, wherein the substrate is an electrically insulating substrate.

7. The manufacturing method of claim 1, wherein the first insulating layer is a silicon nitride layer.

8. The manufacturing method of claim 1, wherein a pad oxide layer is formed between the second conductivity type silicon layer and the first insulating layer.

9. The manufacturing method of claim 1, wherein the second insulating layer is a silicon dioxide layer.

10. The manufacturing method of claim 1, wherein the conducting layer is a metallic layer.

11. The manufacturing method of claim 10, wherein the metallic layer is made of aluminum.

12. The manufacturing method of claim 10, wherein the metallic layer is made of tungsten.

13. The manufacturing method of claim 1, wherein the conducting layer is a polysilicon layer.

14. The manufacturing method of claim 1, wherein step (d) further includes the steps of:
   removing the second insulating layer so as to expose the first insulating layer such that exposed surface of the second insulating layer is substantially in same plane as exposed surface of the first insulating layer.

15. The manufacturing method of claim 14, wherein the step of removing the second insulating layer is by a chemical-mechanical polishing method.

16. The manufacturing method of claim 14, wherein the step of removing the second insulating layer is by an etch-back method.

17. The manufacturing method of claim 1, wherein the bit lines above the substrate are parallel.

* * * * *